(12) United States Patent
Lin et al.

(10) Patent No.: US 9,929,735 B2
(45) Date of Patent: Mar. 27, 2018

(54) PHASE CORRECTION OF MULTIPLE PHASE CLOCK TRANSMISSION AND METHOD FOR PERFORMING THE SAME

(71) Applicant: TAIWAN SEMICONDUCTOR MANUFACTURING COMPANY, LTD., Hsinchu (TW)

(72) Inventors: Chih-Chang Lin, San Jose, CA (US); Chan-Hong Chern, Palo Alto, CA (US); Tsung-Ching Huang, San Jose, CA (US); Ming-Chieh Huang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 678 days.

(21) Appl. No.: 14/088,587

(22) Filed: Nov. 25, 2013

(65) Prior Publication Data

US 2015/0145579 A1    May 28, 2015

(51) Int. Cl.
*H03K 3/00*      (2006.01)
*H03H 11/00*     (2006.01)
*H03K 5/13*      (2014.01)
*H03L 7/081*     (2006.01)

(52) U.S. Cl.
CPC ................... *H03L 7/0814* (2013.01)

(58) Field of Classification Search
CPC .......................................... H03L 7/00
USPC ....... 327/231, 233, 234, 237, 258, 291, 296, 327/295, 244
See application file for complete search history.

(56) References Cited

U.S. PATENT DOCUMENTS

| | | | |
|---|---|---|---|
| 7,183,821 B1 * | 2/2007 | Chao ............ | H03L 7/0812 327/149 |
| 2002/0036532 A1 * | 3/2002 | Chen ........... | H03K 3/0322 327/246 |
| 2006/0274874 A1 * | 12/2006 | Kumar ............ | H03L 7/0814 375/362 |
| 2008/0063125 A1 * | 3/2008 | Chatwin ........... | H03L 7/0814 375/355 |
| 2009/0074127 A1 * | 3/2009 | Liu .................. | H03L 7/087 375/376 |
| 2010/0098203 A1 * | 4/2010 | Chien ............ | H03L 7/0807 375/371 |
| 2010/0117692 A1 * | 5/2010 | Yoon ................. | H03K 5/13 327/144 |
| 2010/0148842 A1 * | 6/2010 | Yoon ................. | G11C 7/22 327/295 |

* cited by examiner

*Primary Examiner* — Lincoln Donovan
*Assistant Examiner* — Metasebia Retebo
(74) *Attorney, Agent, or Firm* — Hauptman Ham, LLP

(57) ABSTRACT

A circuit includes a first circuit, a second circuit and a third circuit. The first circuit is configured to receive a first phase of a clock signal, a second phase of a clock signal and a first control signal. The first circuit is configured to generate a first interpolated phase of a clock signal. The second circuit is configured to receive a third phase of a clock signal, a fourth phase of a clock signal and a second control signal, and generate a second interpolated phase of a clock signal. The third circuit is configured to receive the first interpolated phase of the clock signal and the second interpolated phase of the clock signal, and generate the first control signal. The first control signal dynamically adjusts the first interpolated phase of the clock signal.

20 Claims, 6 Drawing Sheets

PHASE CORRECTION OF MULTIPLE PHASE CLOCK TRANSMISSION AND METHOD FOR PERFORMING THE SAME

BACKGROUND

Modern electronics rely on clock signals that oscillate between a high and a low state. As integrated circuits have changed, multiple-phase clocks are transmitted in multiple lanes/channels and over varying distances. Supplying accurate and synchronized clocks to all circuits dependent upon the multiple-phase clocks increases the overall system complex. In some approaches, phase detectors are utilized in order to detect the phase difference between two signal inputs.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1:
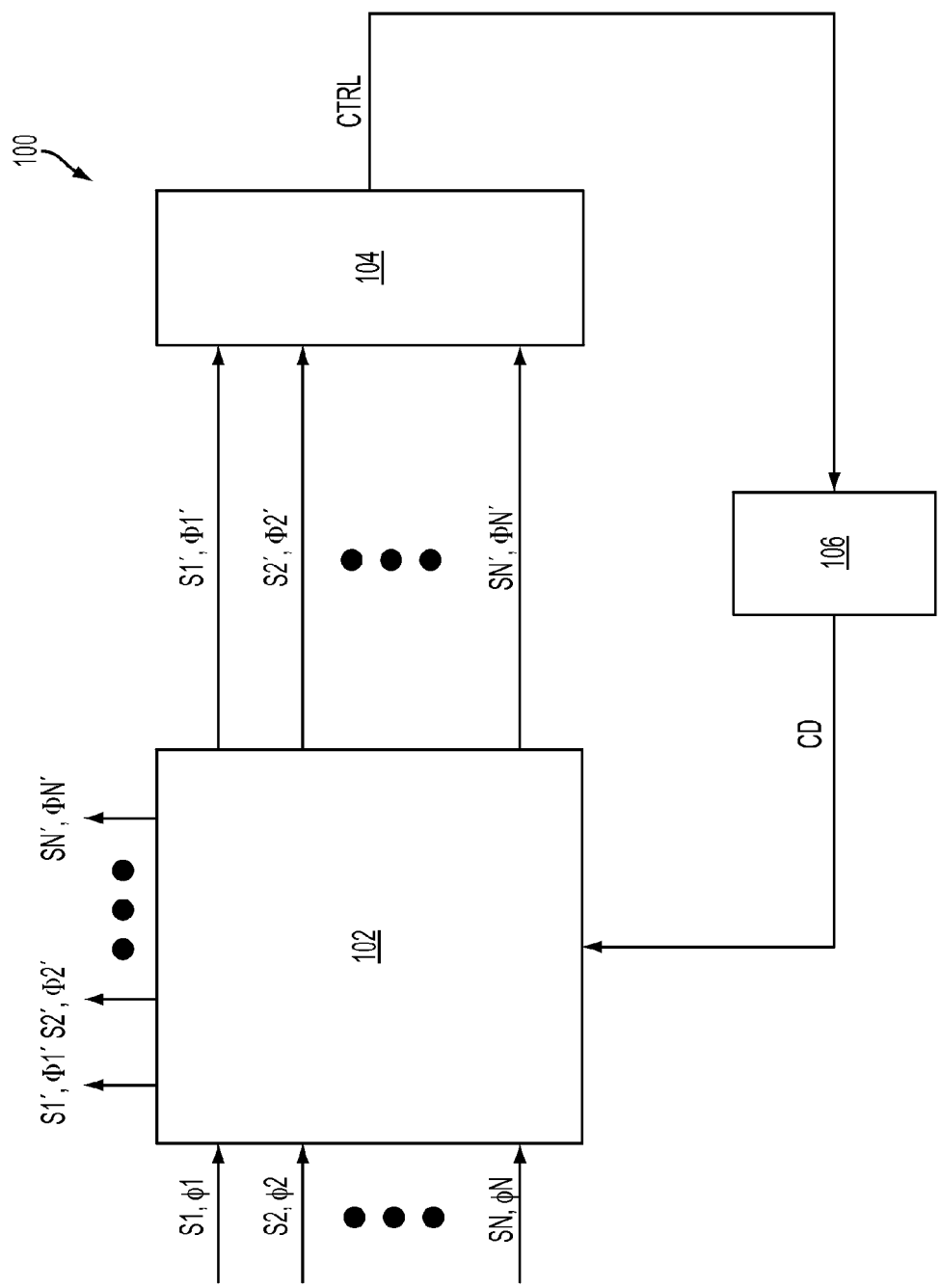
FIG. 1 is a block diagram in accordance with one or more embodiments.

The following disclosure provides many different embodiments, or examples, for implementing different features of the disclosed subject matter. Specific examples of components and arrangements are described below to simplify the present disclosure. These are examples and are not intended to be limiting.

This description of the various embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

FIG. 1 is a block diagram of a phase device 100 in accordance with one or more embodiments. The phase device 100 includes a phase interpolator 102, a phase detector 104 and a control block 106. The phase device 100 is configured to receive one or more external signals S1, S2, ... SN (where N is an integer corresponding to the number of inputs into the phase device 100), where each signal has a corresponding phase signal Phi1, Phi2, ... PhiN, where each of the phase signals Phi1, Phi2, ... PhiN is relative to one another. In one or more embodiments, external signals S1, S2, ... SN include a clock signal. In one or more embodiments, external signals S1, S2, ... SN include signals with a single fundamental frequency, multiple frequencies or harmonic frequencies. The phase device 100 sends one or more interpolated signals S1', S2', ... SN' (where N' is an integer corresponding to the number of phase inputs into the phase device 100) to an external destination. Each interpolated signal S1', S2', ... , SN' includes a corresponding interpolated phase signal Phi1', Phi2', ... , PhiN', where each of the interpolated phase signals Phi1', Phi2', ... , PhiN' is relative to one another. In one or more embodiments, interpolated signals S1', S2', ... SN' include a clock signal. In one or more embodiments, interpolated signals S1', S2', ... SN' include signals with a single fundamental frequency, multiple frequencies or harmonic frequencies. In one or more embodiments, the phase device 100 is implemented wholly or partly on a single integrated circuit (also referred to as a chip), or on a multi-chip structure. In one or more embodiments, one or more components of the phase device 100 are configured as discrete components and are mounted on a printed circuit board (PCB) having conductive traces that connect the discrete components to the chip or chips containing the remaining components.

The phase interpolator 102 is coupled to one or more external destinations. The phase interpolator 102 is coupled to phase detector 104 and control block 106. The phase interpolator 102 is configured to receive signals S1, S2, ... SN and the corresponding phase signals Phi1, Phi2, ... PhiN from an external source and/or one or more control signals CD from control block 106, and is configured to generate/send interpolated signals S1', S2', ... SN' and the corresponding interpolated phase signals Phi1', Phi2', ... PhiN' to phase detector 104 and/or an external destination.

The phase detector 104 is coupled to phase interpolator 102 and control block 106. The phase detector 104 is configured to receive interpolated signals S1', S2', ... SN' and the corresponding interpolated phase signals Phi1', Phi2', ... PhiN' from phase interpolator 102, and is configured to generate/send one or more control signals CTRL to control block 106.

The control block 106 is coupled to phase detector 104 and phase interpolator 102. The control block 106 is configured to receive one or more control signals CTRL from phase detector 104, and is configured to generate/send one or more control signals CD to phase interpolator 102.

Figure 2A:
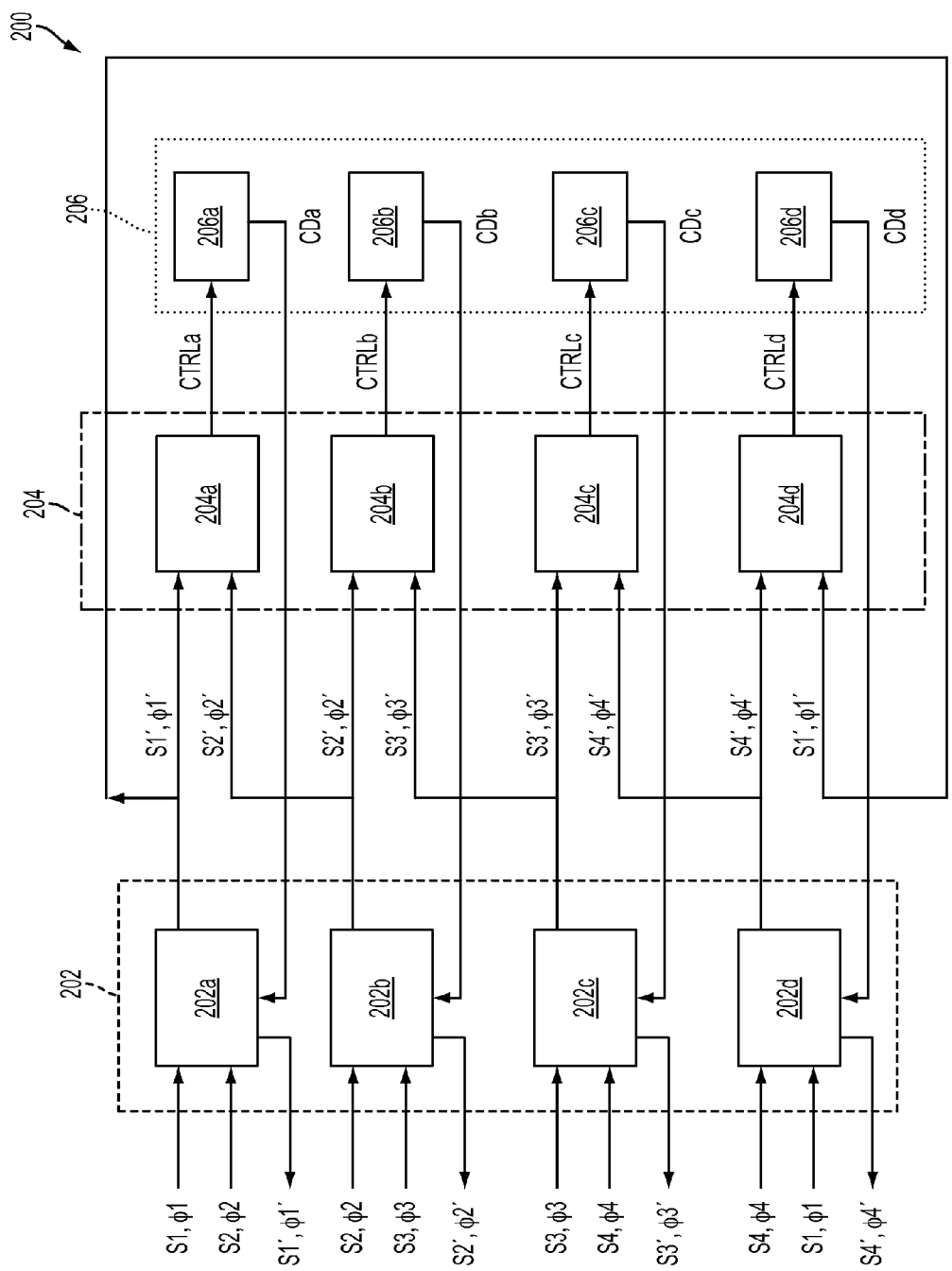
FIG. 2A is a block diagram in accordance with one or more embodiments.

FIG. 2A is a block diagram in accordance with one or more embodiments. In one or more embodiments, when the phase device 100 of FIG. 1 has 4 inputs and 4 outputs such that N & N' are equal to 4, yields the phase device 200. The phase device 200 includes a phase interpolator 202, a phase detector 204 and a control block 206. The phase interpolator 202 is usable as the phase interpolator 102 of FIG. 1, the phase detector 204 is usable as the phase detector 104 of FIG. 1 and the control block 206 is usable as the control block 106 of FIG. 1. For example, in at least this embodiment, external signals S1, S2, S3 and S4 include corresponding adjacent phase signals Phi1, Phi2, Phi3 and Phi4, which have a phase offset e.g., of 90 degrees. In some embodiments, the phase offset of each signal S1, S2, S3 and S4 is the same, different or any of the combination thereof. For at least this example, the connections between the devices previously described in FIG. 1 apply to the example described in FIG. 2A.

The phase interpolator 202 includes phase interpolators 202a, 202b, 202c and 202d. The phase detector 204 includes phase detectors 204a, 204b, 204c and 204d. The control block 206 includes control blocks 206a, 206b, 206c and 206d.

The phase interpolator 202a is connected to phase detector 204a and control block 206a. The phase interpolator 202a is configured to receive signals S1 and S2 including the corresponding adjacent phase signals Phi1 and Phi2 from an external source and/or control signal CDa from control block 206a, and is configured to generate/send interpolated signal S1' including the corresponding interpolated phase signal Phi1' to phase detector 204a and 204d and/or an external destination.

The phase interpolator 202b is connected to phase detector 204b and control block 206b. The phase interpolator 202b is configured to receive signals S2 and S3 including the corresponding adjacent phase signals Phi2 and Phi3 from an external source and/or control signal CDb from control block 206b, and is configured to generate/send interpolated signal S2' including the corresponding interpolated phase signal Phi2' to phase detector 204a and 204b and/or an external destination.

The phase interpolator 202c is connected to phase detector 204c and control block 206c. The phase interpolator 202c is configured to receive signals S3 and S4 including the corresponding adjacent phase signals Phi3 and Phi4 from an external source and/or control signal CDc from control block 206c, and is configured to generate/send interpolated signal S3' including the corresponding interpolated phase signal Phi3' to phase detector 204c and 204b and/or an external destination.

The phase interpolator 202d is connected to phase detector 204d and control block 206d. The phase interpolator 202d is configured to receive signals S4 and S1 including the corresponding adjacent phase signals Phi4 and Phi1 from an external source and/or control signal CDd from control block 206d, and is configured to generate/send interpolated signal S4' including the corresponding interpolated phase signal Phi4' to phase detector 204d and 204c and an external destination.

The phase detector 204a is coupled to phase interpolators 202a and 202b and control block 206a. The phase detector 204a is configured to receive interpolated signals S1' and S2' including the corresponding interpolated phase signals Phi1' and Phi2' from phase interpolators 202a and 202b, and is configured to generate/send control signal CTRLa to control block 206a.

The phase detector 204b is coupled to phase interpolators 202b and 202c and control block 206b. The phase detector 204b is configured to receive interpolated signals S2' and S3' including the corresponding interpolated phase signals Phi2' and Phi3' from phase interpolators 202b and 202c, and is configured to generate/send control signal CTRLb to control block 206b.

The phase detector 204c is coupled to phase interpolators 202c and 202d and control block 206c. The phase detector 204c is configured to receive interpolated signals S3' and S4' including the corresponding interpolated phase signals Phi3' and Phi4' from phase interpolators 202c and 202d, and is configured to generate/send control signal CTRLc to control block 206c.

The phase detector 204d is coupled to phase interpolators 202d and 202a and control block 206d. The phase detector 204d is configured to receive interpolated signals S4' and S1' including the corresponding interpolated phase signals Phi4' and Phi1' from phase interpolators 202d and 202a, and is configured to generate/send control signal CTRLd to control block 206d.

The control block 206a is coupled to phase detector 204a and phase interpolator 202a. The control block 206a is configured to receive control signal CTRLa from phase detector 204a, and is configured to generate/send control signal CDa to phase interpolator 202a.

The control block 206b is coupled to phase detector 204b and phase interpolator 202b. The control block 206b is configured to receive control signal CTRLb from phase detector 204b, and is configured to generate/send control signal CDb to phase interpolator 202b.

The control block 206c is coupled to phase detector 204c and phase interpolator 202c. The control block 206c is configured to receive control signal CTRLc from phase detector 204c, and is configured to generate/send control signal CDc to phase interpolator 202c.

The control block 206d is coupled to phase detector 204d and phase interpolator 202d. The control block 206d is configured to receive control signal CTRLd from phase detector 204d, and is configured to generate/send control signal CDd to phase interpolator 202d.

Figure 2B:
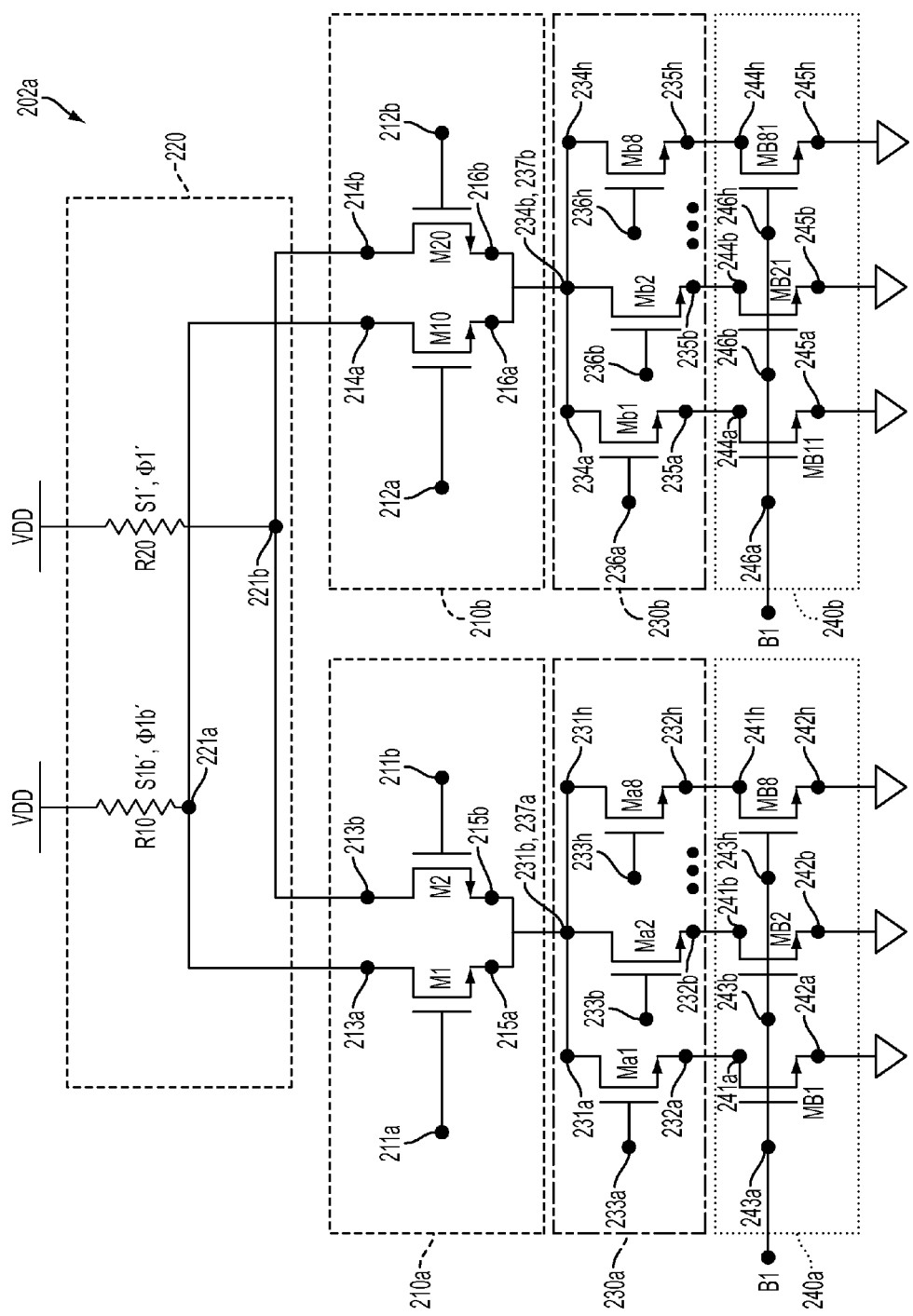
FIG. 2B is a schematic diagram of a phase interpolator in accordance with one or more embodiments.

FIG. 2B is a schematic diagram of phase interpolator 202a, e.g., that previously disclosed in FIG. 2A, in accordance with one or more embodiments. The phase interpolator 202a includes an input stage 210a and 210b, an output stage 220, a selective control stage 230a and 230b, and a bias stage 240a and 240b. The input stage 210a and 210b is directly connected to the output stage 220 and is connected to the selective control stage 230a and 230b. The input stage 210a and 210b is connected to the bias stage 240a and 240b via the selective control stage 230a and 230b. In one or more embodiments, the phase interpolator 202a includes a current mode logic inverter unit.

The input stage 210a and 210b is configured to receive signals S1 and S2 and their corresponding differential signals S1b and S2b. Signals S1 and S2 include corresponding adjacent phase signals Phi1 and Phi2 and differential signals S1b and S2b include corresponding adjacent phase signals Phi1b and Phi2b. The input stage 210a and 210b includes a first input stage 210a to receive and/or process signals S1 and S1b, and a second input stage 210b to receive and/or process signals S2 and S2b.

The output stage 220 is configured to send interpolated signal S1' and differential interpolated signal S1b'. Interpolated signal S1' includes corresponding interpolated phase signal Phi1' and interpolated signal S1b' includes corresponding interpolated phase signal Phi1b'.

The selective control stage 230a and 230b controls the degree of change in phase between the received signals and output signals. Bias stage 240a and 240b is configured to bias the elements contained in the phase interpolator 202a.

The input stage 210a and 210b includes input nodes 211a, 211b, 212a and 212b. The input stage 210a and 210b is coupled to the output stage 220 via output node 221a and 221b. The input stage 210a and 210b is coupled to the selective control stage 230a and 230b via U control nodes 237a and 237b. The input stage 210a and 210b is coupled to the bias stage 240a and 240b via selective control stage 230a and 230b.

The first input stage 210a receives an input signal S1 and differential signal S1b via input nodes 211a and 211b. Signal S1 includes corresponding phase signal Phi1 and differential signal S1b includes corresponding phase signal Phi1b. Input node 211a is connected to the gate terminal of NMOS transistor M1 and input node 211b is connected to the gate terminal of NMOS transistor M2. Transistor M1 is connected to NMOS transistor M10 via output node 221a. Transistor M2 is connected to NMOS transistor M20 via output node 221b.

The second input stage 210b receives an input signal S2 and differential signal S2b via input nodes 212a and 212b. Signal S2 includes corresponding phase signal Phi2 and differential signal S2b includes corresponding phase signal Phi2. Input node 212a is connected to the gate terminal of transistor M10 and input node 212b is connected to the gate terminal of transistor M20.

Transistor M1 includes a first terminal 213a coupled to the output node 221a, a second terminal 215a coupled to the selective control stage 230a, and a gate terminal connected to the input node 211a. For example, the first terminal 213a is a drain, and the second terminal 215a is a source of the transistor M1. In some embodiments, transistor M1 is operated in a linear region. In some embodiments, transistor M1 is operated in a cutoff region.

Transistor M2 includes a first terminal 213b coupled to the output node 221b, a second terminal 215b coupled to the selective control stage 230a, and a gate terminal connected to the input node 211b. For example, the first terminal 213b is a drain, and the second terminal 215b is a source of the transistor M2. In some embodiments, transistor M2 is operated in a linear region. In some embodiments, transistor M2 is operated in a cutoff region.

Transistor M10 includes a first terminal 214a coupled to the output node 221a, a second terminal 216a coupled to the selective control stage 230b, and a gate terminal connected to the input node 212a. For example, the first terminal 214a is a drain, and the second terminal 216a is a source of the transistor M10. In some embodiments, transistor M10 is operated in a linear region. In some embodiments, transistor M10 is operated in a cutoff region.

Transistor M20 includes a first terminal 214b coupled to the output node 221b, a second terminal 216b coupled to the selective control stage 230b, and a gate terminal connected to the input node 212b. For example, the first terminal 214b is a drain, and the second terminal 216b is a source of the transistor M20. In some embodiments, transistor M20 is operated in a linear region. In some embodiments, transistor M20 is operated in a cutoff region.

The output stage 220 is connected to the input stage 210a and 210b via output nodes 221a and 221b. The output stage 220 is configured to send interpolated signal S1' and differential interpolated signal S1b'. Interpolated signal S1' includes corresponding interpolated phase signal Phi1' and interpolated signal S1b' includes corresponding interpolated phase signal Phi1b'. The output stage 220 includes resistors R10 and R20. Resistor R10 is connected in series between voltage source VDD and output node 221a. Resistor R20 is connected in series between voltage source VDD and output node 221b. The output of the phase interpolator 202a will be bounded by the range of values between signals S1, S1b and S2, S2b. In one or more embodiments, the output of the phase interpolator 202a will be bounded by the range of values between the adjacent phase signals Phi1, Phi1b to adjacent phase signals Phi2, Phi2b based upon selective control stage 230a and 230b and bias stage 240a and 240b.

The selective control stage 230a and 230b is configured to control the amount or degree of change in phase between the received signals S1, S2 and output signal S1'. The selective control stage 230a and 230b is connected to the input stage 210a and 210b via U control nodes 237a and 237b. U control node 237a is connected to the first input stage 210a of the phase interpolator 202a. U control node 237b is connected to the second input stage 210b of the phase interpolator 202a. Selective control stage 230a is connected to the first input stage 210a of the phase interpolator 202a via U control node 237a. Selective control stage 230b is connected to the second input stage 210b of the phase interpolator 202a via U control node 237b. The amount of control selective control stage 230a and 230b has over the phase interpolator 202a is adjusted based upon selective control stage 230a and 230b. Selective control stage 230a controls the output of the phase interpolator 202a to approach signal S1. In one or more embodiments, selective control stage 230a controls the output of the phase interpolator 202a to approach phase signal Phi1. Similarly, selective control stage 230b controls the output of the phase interpolator 202a to approach signal S2. In one or more embodiments, selective control stage 230b controls the output of the phase interpolator 202a to approach phase signal Phi2. Selective control stage 230a and 230b are in a push-pull relationship allowing for the output of the phase interpolator 202a to be bounded by signals S1 and S2. In one or more embodiments, selective control stage 230a and 230b are in a push-pull relationship allowing for the output of the phase interpolator 202a to be bounded by the range of values of phase signals, Phi1 and Phi2. For example, the more control the selective control stage 230a has on the phase interpolator output, the less control the selective control stage 230b has on the phase interpolator output. Similarly, for example, the less control the selective control stage 230a has on the phase interpolator output, the more control the selective control stage 230b has on the phase interpolator output.

Selective control stage 230a includes NMOS transistors Ma1, Ma2, Ma3, Ma4, Ma5, Ma6, Ma7 and Ma8. Each of the transistors Ma1, Ma2, Ma3, Ma4, Ma5, Ma6, Ma7 and Ma8 includes a corresponding first terminal 231a, 231b, 231c, 231d, 231e, 231f, 231g and 231h. Each of the transistors Ma1, Ma2, Ma3, Ma4, Ma5, Ma6, Ma7 and Ma8 includes a corresponding second terminal 232a, 232b, 232c, 232d, 232e, 232f, 232g and 232h. Each of the transistors Ma1, Ma2, Ma3, Ma4, Ma5, Ma6, Ma7 and Ma8 includes a corresponding gate terminal 233a, 233b, 233c, 233d, 233e, 233f, 233g and 233h. For example, for each of the transistors Ma1, Ma2, Ma3, Ma4, Ma5, Ma6, Ma7 and Ma8, the first terminals 231a, 231b, 231c, 231d, 231e, 231f, 231g and 231h are a drain, and the second terminals 232a, 232b, 232c, 232d, 232e, 232f, 232g and 232h are a source. The first terminal 231a, 231b, 231c, 231d, 231e, 231f, 231g and 231h for each of the transistors Ma1, Ma2, Ma3, Ma4, Ma5, Ma6, Ma7 and Ma8 is connected to U control node 237a.

The second terminal 231a for transistor Ma1 is connected in series to the first terminal 241a of transistor MB1. The second terminal 231b for transistor Ma2 is connected in series to the first terminal 241b of transistor MB2. The second terminal 231c for transistor Ma3 is connected in series to the first terminal 241c of transistor MB3. The second terminal 231d for transistor Ma4 is connected in series to the first terminal 241d of transistor MB4. The second terminal 231e for transistor Ma5 is connected in series to the first terminal 241e of transistor MB5. The second terminal 231f for transistor Ma6 is connected in series to the first terminal 241f of transistor MB6. The second terminal 231g for transistor Ma7 is connected in series to the first terminal 241g of transistor MB7. The second terminal 231h for transistor Ma8 is connected in series to the first terminal 241h of transistor MB8.

The gate terminals 233a, 233b, 233c, 233d, 233e, 233f, 233g and 233h for each of the corresponding transistors Ma1, Ma2, Ma3, Ma4, Ma5, Ma6, Ma7 and Ma8 are connected to control block 206a from FIG. 2A. Control block 206a sends a control signal CDa. In one or more examples, control signal CDa includes eight data fields or eight bits, where each individual data field or bit controls the operation of one of the transistors Ma1, Ma2, Ma3, Ma4, Ma5, Ma6, Ma7 and Ma8. The control signal CDa controls the operation of transistors Ma1, Ma2, Ma3, Ma4, Ma5, Ma6, Ma7 and Ma8 to each operate like a switch. For example, when the gate terminal 233a receives a control signal CDa that is a logical "one", then the corresponding transistor Ma1 will "turn-on" allowing current to flow between the first terminal 231a and the second terminal 232a. Similarly, for example, when the gate terminal 233a receives a control signal CDa that is a logical "zero", then the corresponding transistor Ma1 will "turn-off" preventing current to flow between the first terminal 231a and the second terminal 232a. The amount of current flowing through each of the transistors Ma1, Ma2, Ma3, Ma4, Ma5, Ma6, Ma1 and Ma8 is controlled by control signal CDa. In one or more embodiments, the amount of current that flows through selective control stage 230a is directly proportional to the amount of control the selective control stage 230a has over the output of the phase interpolator 202a yielding an output signal S1' (and corresponding phase signal Phi1') that more approaches the input signal S1 (and corresponding phase signal Phi1) to the first stage of the phase detector 204a.

Selective control stage 230b includes NMOS transistors Mb1, Mb2, Mb3, Mb4, Mb5, Mb6, Mb7 and Mb8. Each of the transistors Mb1, Mb2, Mb3, Mb4, Mb5, Mb6, Mb7 and Mb8 includes a corresponding first terminal 234a, 234b, 234c, 234d, 234e, 234f, 234g and 234h. Each of the transistors Mb1, Mb2, Mb3, Mb4, Mb5, Mb6, Mb7 and Mb8 includes a corresponding second terminal 235a, 235b, 235c, 235d, 235e, 235f, 235g and 235h. Each of the transistors Mb1, Mb2, Mb3, Mb4, Mb5, Mb6, Mb7 and Mb8 includes a corresponding gate terminal 236a, 236b, 236c, 236d, 236e, 236f, 236g and 236h. For example, for each of the transistors Mb1, Mb2, Mb3, Mb4, Mb5, Mb6, Mb7 and Mb8, the first terminals 234a, 234b, 234c, 234d, 234e, 234f, 234g and 234h are a drain, and the second terminals 235a, 235b, 235c, 235d, 235e, 235f, 235g and 235h are a source. The first terminal 234a, 234b, 234c, 234d, 234e, 234f, 234g and 234h for each of the transistors Mb1, Mb2, Mb3, Mb4, Mb5, Mb6, Mb7 and Mb8 is connected to U control node 237b.

The second terminal 235a for transistor Mb1 is connected in series to the first terminal 244a of transistor MB11. The second terminal 235b for transistor Mb2 is connected in series to the first terminal 244b of transistor MB21. The second terminal 235c for transistor Mb3 is connected in series to the first terminal 244c of transistor MB31. The second terminal 235d for transistor Mb4 is connected in series to the first terminal 244d of transistor MB41. The second terminal 235e for transistor Mb5 is connected in series to the first terminal 244e of transistor MB51. The second terminal 235f for transistor Mb6 is connected in series to the first terminal 244f of transistor MB61. The second terminal 235g for transistor Mb7 is connected in series to the first terminal 244g of transistor MB71. The second terminal 235h for transistor Mb8 is connected in series to the first terminal 244h of transistor MB81.

The gate terminals 236a, 236b, 236c, 236d, 236e, 236f, 236g and 236h for each of the corresponding transistors Mb1, Mb2, Mb3, Mb4, Mb5, Mb6, Mb7 and Mb8 are connected to control block 206a from FIG. 2A. Control block 206a sends a control signal CDa. In one or more examples, control signal CDa includes eight data fields or eight bits, where each individual data field or bit controls the operation of one of the transistors Mb1, Mb2, Mb3, Mb4, Mb5, Mb6, Mb7 and Mb8. The control signal CDa controls the operation of transistors Mb1, Mb2, Mb3, Mb4, Mb5, Mb6, Mb7 and Mb8 to each operate like a switch. For example, when the gate terminal 236a receives a control signal CDa that is a logical "one", then the corresponding transistor Mb1 will "turn-on" allowing current to flow between the first terminal 234a and the second terminal 235a. Similarly, for example, when the gate terminal 236a receives a control signal CDa that is a logical "zero", then the corresponding transistor Mb1 will "turn-off" preventing current to flow between the first terminal 234a and the second terminal 235a. The amount of current flowing through each of the transistors Mb1, Mb2, Mb3, Mb4, Mb5, Mb6, Mb7 and Mb8 is controlled by control signal CDa. In one or more embodiments, the amount of current that flows through selective control stage 230b is directly proportional to the amount of control the selective control stage 230b has over the output of the phase interpolator 202a yielding an output signal S1' (and corresponding phase signal Phi1') that more approaches the input signal S2 (and corresponding phase signal Phi2) to the first stage of the phase detector 204a. In some embodiments, the number of transistors in selective control stage 230a or selective control stage 230b is one or more. In some embodiments, the number of transistors in bias stage 240a or bias stage 240b is one or more.

Bias stage 240a and 240b is configured to bias the elements contained in the phase interpolator 202a. The bias stage 240a and 240b is connected to the selective control stage 230a and 230b. The bias stage 240a and 240b includes bias stages 240a and 240b. Bias stage 240a is indirectly connected to the first input stage 210a of the phase interpolator 202a via selective control stage 230a. Bias stage 240b is indirectly connected to the second input stage 210b of the phase interpolator 202a via selective control stage 230b. In one or more embodiments, the bias stage 240a and 240b biases the circuit elements of phase interpolator 202a.

The bias stage 240a includes NMOS transistors MB1, MB2, MB3, MB4, MB5, MB6, MB7 and MB8. Each of the transistors MB1, MB2, MB3, MB4, MB5, MB6, MB7 and MB8 includes a corresponding first terminal 241a, 241b, 241c, 241d, 241e, 241f, 241g and 241h. Each of the transistors MB1, MB2, MB3, MB4, MB5, MB6, MB7 and MB8 includes a corresponding second terminal 242a, 242b, 242c, 242d, 242e, 242f, 242g and 242h. Each of the transistors MB1, MB2, MB3, MB4, MB5, MB6, MB7 and MB8 includes a corresponding gate terminal 243a, 243b, 243c, 243d, 243e, 243f, 243g and 243h. For example, for each of the transistors MB1, MB2, MB3, MB4, MB5, MB6, MB7 and MB8, the first terminals 241a, 241b, 241c, 241d, 241e, 241f, 241g and 241h are a drain, and the second terminals 242a, 242b, 242c, 242d, 242e, 242f, 242g and 242h are a source. The second terminal 242a, 242b, 242c, 242d, 242e, 242f, 242g and 242h for each of the transistors MB1, MB2, MB3, MB4, MB5, MB6, MB7 and MB8 is connected to ground. Each of the gate terminals 243a, 243b, 243c, 243d, 243e, 243f, 243g and 243h for each of the corresponding transistors MB1, MB2, MB3, MB4, MB5, MB6, MB7 and MB8 is connected to a common bias node B1.

The bias stage 240*b* includes NMOS transistors MB11, MB21, MB31, MB41, MB51, MB61, MB71 and MB81. Each of the transistors MB11, MB21, MB31, MB41, MB51, MB61, MB71 and MB81 includes a corresponding first terminal 244*a*, 244*b*, 244*c*, 244*d*, 244*e*, 244*f*, 244*g* and 244*h*. Each of the transistors MB11, MB21, MB31, MB41, MB51, MB61, MB71 and MB81 includes a corresponding second terminal 245*a*, 245*b*, 245*c*, 245*d*, 245*e*, 245*f*, 245*g* and 245*h*. Each of the transistors MB11, MB21, MB31, MB41, MB51, MB61, MB71 and MB81 includes a corresponding gate terminal 246*a*, 246*b*, 246*c*, 246*d*, 246*e*, 246*f*, 246*g* and 246*h*. For example, for each of the transistors MB11, MB21, MB31, MB41, MB51, MB61, MB71 and MB81, the first terminals 244*a*, 244*b*, 244*c*, 244*d*, 244*e*, 244*f*, 244*g* and 244*h* are a drain, and the second terminals 245*a*, 245*b*, 245*c*, 245*d*, 245*e*, 245*f*, 245*g* and 245*h* are a source. The second terminal 245*a*, 245*b*, 245*c*, 245*d*, 245*e*, 245*f*, 245*g* and 245*h* for each of the transistors MB11, MB21, MB31, MB41, MB51, MB61, MB71 and MB81 is connected to ground. Each of the gate terminals 246*a*, 246*b*, 246*c*, 246*d*, 246*e*, 246*f*, 246*g* and 246*h* for each of the corresponding transistors MB11, MB21, MB31, MB41, MB51, MB61, MB71 and MB81 is connected to a common bias node B1.

Figure 3:
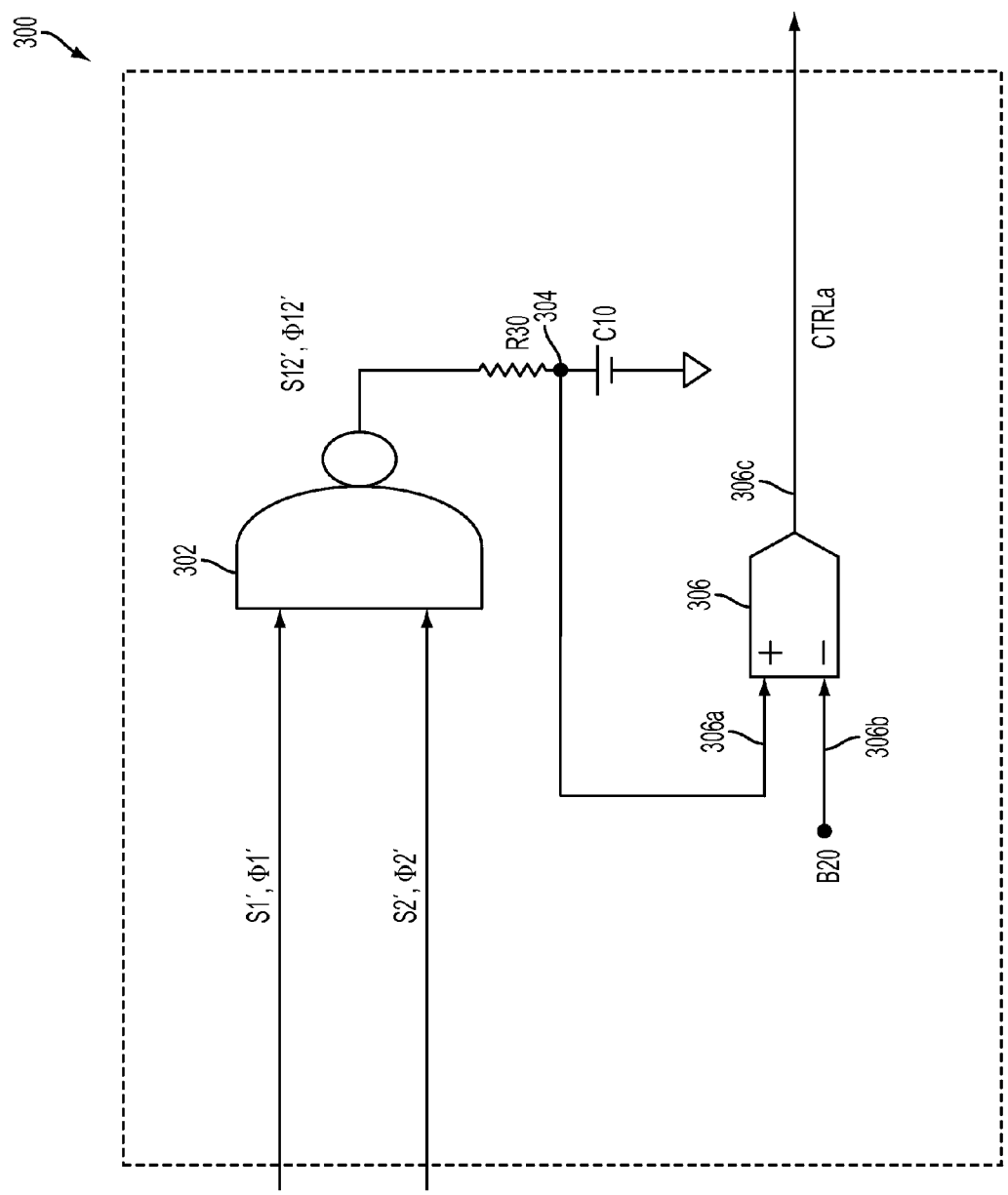
FIG. 3 is a schematic diagram of a phase detector in accordance with one or more embodiments.

FIG. 3 is a schematic diagram of phase detector 300 in accordance with one or more embodiments. Phase detector 300 is usable as the phase detector 204*a* previously shown in FIG. 2A. The phase detector 300 includes NAND gate 302, resistor R30, capacitor C10 and comparator 306. The phase detector 300 determines if the interpolated signal S1' is early or late when compared to the adjacent interpolated signal S2' and generates an early or late control signal CTRLa to adjust the phase interpolator 202*a*. In one or more embodiments, the phase detector 300 determines if the interpolated phase signal Phi1' is early or late when compared to the adjacent interpolated phase signal Phi2' and generates an early or late control signal CTRLa to adjust the phase interpolator 202*a*.

NAND gate 302 receives interpolated signals S1' and S2' including corresponding phase signals Phi1' and Phi2' from phase interpolator 202*a*. The NAND gate 302 outputs a signal S12', Phi12' to resistor R30. In at least one example, the output signal S12' including corresponding phase signal Phi12' is at a logical level "one" for periods of time when both interpolated signals S1' (including corresponding interpolated phase signal Phi1') and S2' (including corresponding interpolated phase signal Phi2') are at a logical level "one"; otherwise the output signal S12' including corresponding phase signal Phi12' is at a logical level "zero".

Resistor R30 is connected in series with NAND gate 302 and is connected to node 304. Node 304 is connected to comparator 306 and capacitor C10. The resistor R30 and capacitor C10 are connected in series and operate as an RC low pass filter. Resistor R30 receives the output signal S12' including corresponding phase signal Phi12' and passes the output signal S12' including corresponding phase signal Phi12' to the capacitor C10 and the comparator 306. The other end of capacitor C10 is connected to ground.

Comparator 306 includes comparator inputs 306*a* and 306*b* and comparator output 306*c*. Comparator input 306*a* is connected to node 304 and receives the filtered signal. Comparator input 306*b* is connected to a bias voltage B20. Comparator output 306*c* is connected to a control block 206*a*. Comparator 306 is configured in an open-loop configuration. Comparator 306 is configured to compare the signals received on comparator inputs 306*a* and 306*b*. When the comparator input 306*a* is at a higher voltage than the comparator input 306*b*, the comparator output 306*c* saturates at the highest positive voltage the comparator 306 outputs. In one or more examples, the comparator output 306*c* is equal to the larger value between comparator inputs 306*a* and 306*b*. When the comparator input 306*a* is at a voltage less than the comparator input 306*b*, the comparator output 306*c* saturates at the most negative voltage the comparator 306 outputs. In one or more embodiments, the comparator output 306*c* is equal to the supply voltage value. In one or more embodiments, an operational amplifier is used for comparator 306. In one or more embodiments, four external signals are received by phase device 100 and the corresponding bias voltage B20 of comparator 306 is approximately ¾ of VDD. In one or more embodiments, eight external signals are received by phase device 100 and the corresponding bias voltage B20 of comparator 306 is approximately ⅞ of VDD. In one or more embodiments, the bias voltage B20 is a value ranging from approximately ¾ of VDD volts to approximately ⅞ of VDD volts (where VDD is a power supply voltage terminal). In one or more embodiments, the low voltage of the comparator 306 is approximately 0 volts.

Comparator output 306*c* outputs a control signal CTRLa to control block 206*a*. The control signal CTRLa instructs the control block 206*a* to advance or delay the interpolated signal S1' including interpolated phase signal Phi1'. In one or more embodiments, N is equal to 4 phases, resulting in a 90 degree separation between each adjacent phase. In some embodiments, the phase offset of each interpolated signal S1', S2', S3' and S4' is the same, different or any of the combination thereof. In one or more embodiments, if the phase difference between interpolated phase signals Phi1' and Phi2' is greater than 90 degrees, then the filtered signal received on comparator input 306*a* will be less than the comparator input 306*b*, value ranging from approximately ¾ of VDD volts to approximately ⅞ of VDD volts, and the resulting comparator output will have a control signal CTRLa equal to a logical "zero". In one or more embodiments, a control signal CTRLa equal to a logical "zero" indicates that interpolated signal S2' (including interpolated phase signal Phi2') is later than it should be in reference to interpolated signal S1' (including interpolated phase signal Phi1'), and the control block 206*a* will instruct the phase interpolator 202*a* to advance the late interpolated signal S2' (including interpolated phase signal Phi2') by one clock cycle. In one or more embodiments, if the phase difference between interpolated phase signals Phi1' and Phi2' is less than 90 degrees, then the filtered signal received on comparator input 306*a* will be greater than the comparator input 306*b*, value ranging from approximately ¾ of VDD volts to approximately ⅞ of VDD volts, and the resulting comparator output will have a control signal CTRLa equal to a value ranging from approximately ¾ of VDD volts to approximately ⅞ of VDD volts which is represented by a logical "one". In one or more embodiments, a control signal CTRLa equal to a logical "one" indicates that interpolated signal S2' (including interpolated phase signal Phi2') is earlier than it should be in reference to interpolated signal S1' (including interpolated phase signal Phi1'), and the control block 206*a* will instruct the phase interpolator 202*a* to delay the earlier interpolated signal S2' (including interpolated phase signal Phi2') by one clock cycle.

Figure 4:
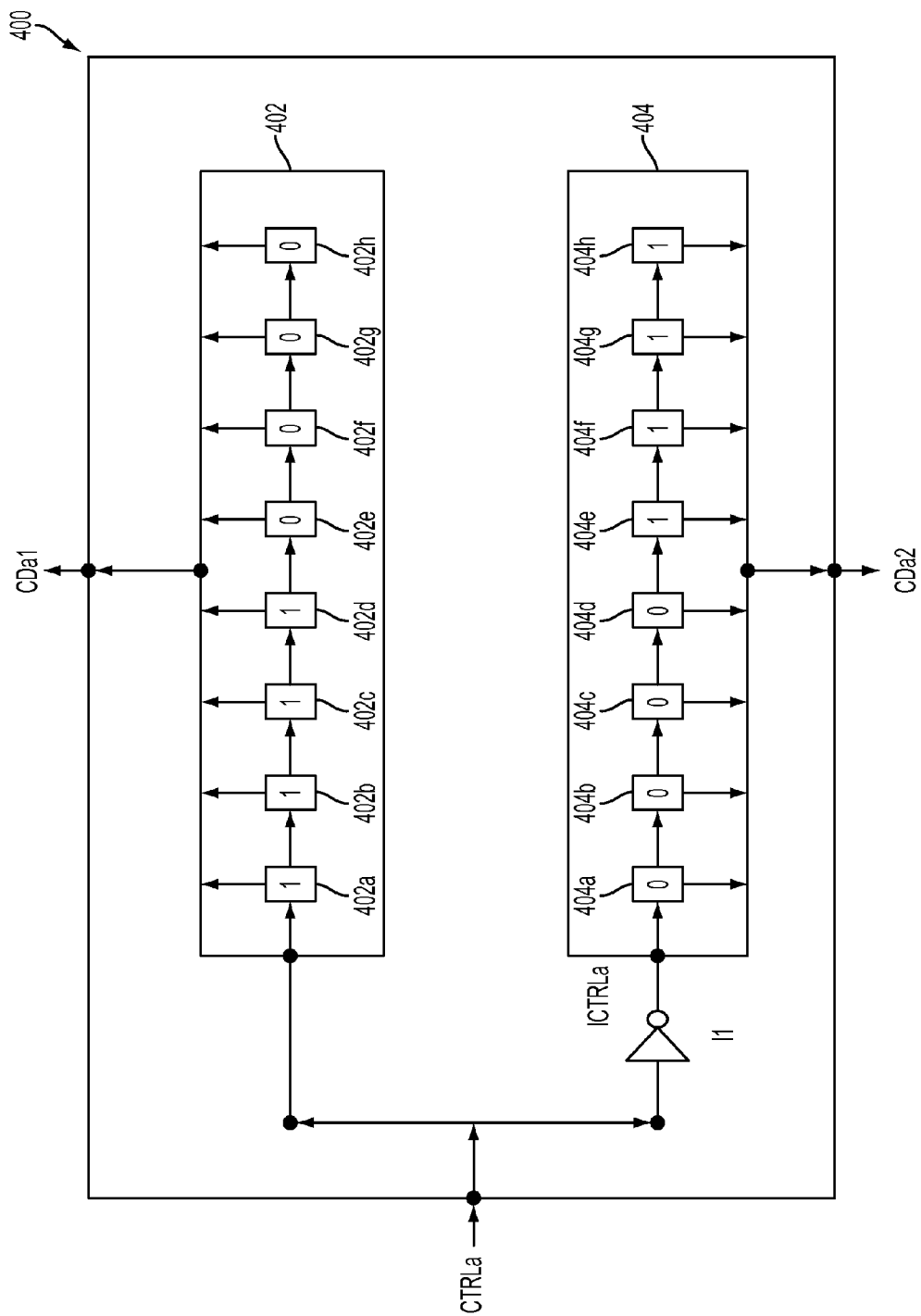
FIG. 4 is a block diagram of a control block in accordance with one or more embodiments.

FIG. 4 is a block diagram of control block 400 in accordance with one or more embodiments. Control block 400 is usable as the control block 206*a* previously shown in FIG. 2A. The control block 400 includes first control unit 402, second control unit 404 and inverter 140. The control block 400 is connected to phase detector 204*a* and phase interpolator 202a. Control block 400 receives control signal CTRLa and generates control signals CDa. In one or more embodiments, control block 400 is implemented via the use of a shift register. In one or more embodiments, control block 400 is implemented via the use of a state machine. Control signal CDa includes control signal CDa1 and control signal CDa2. Control signal CDa1 controls the phase interpolator 202a by controlling selective control stage 230a and control signal CDa2 controls selective control stage 230b.

The first control unit 402 includes adjacent storage elements 402a, 402b, 402c, 402d, 402e, 402f, 402g and 402h. The first control unit 402 receives control signal CTRLa and generates control signal CDa1. With each cycle of the clock, a new control signal CTRLa is received and the contents of each storage unit 402a, 402b, 402c, 402d, 402e, 402f, 402g is shifted to the next or successive unit and the contents of the last storage element 402h is discarded. With each cycle of the clock, the contents of each storage unit 402a, 402b, 402c, 402d, 402e, 402f, 402g and 402h is sent to the phase interpolator 202a via control message CDa1.

Inverter 140 inverts the received control signal CTRLa and sends the inverted control signal ICTRLa to the second control unit 404.

The second control unit 404 includes adjacent storage elements 404a, 404b, 404c, 404d, 404e, 404f, 404g and 404h. The second control unit 404 receives inverted control signal ICTRLa and generates control signal CDa2. With each cycle of the clock, a new inverted control signal ICTRLa is received and the contents of each storage unit 404a, 404b, 404c, 404d, 404e, 404f and 404g is shifted to the next or successive unit and the contents of the last storage element 404h is discarded. With each cycle of the clock, the contents of each storage unit 404a, 404b, 404c, 404d, 404e, 404f, 404g and 404h is sent to the phase interpolator 202a via control message CDa2.

Figure 5:
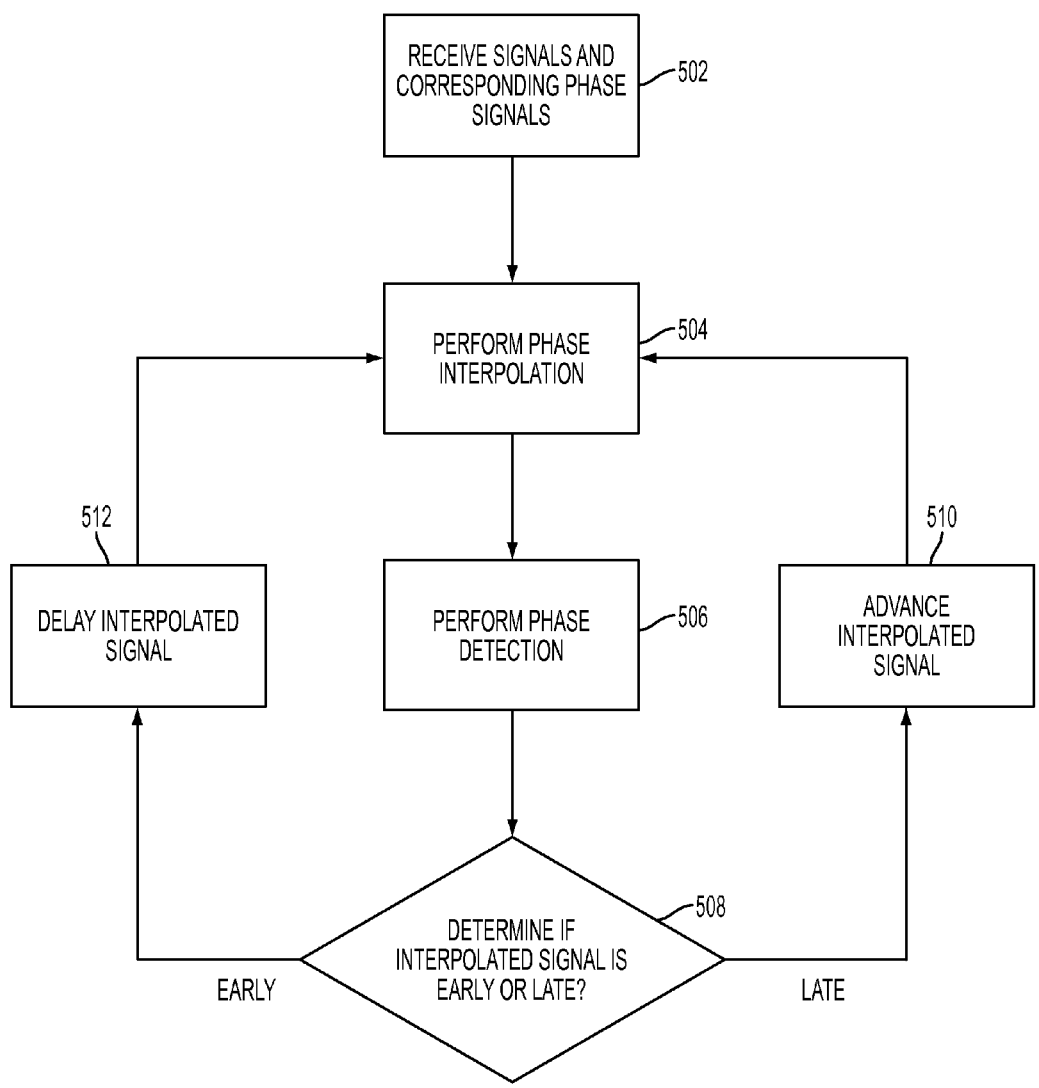
FIG. 5 is a flow chart illustrating how phase interpolation is adjusted in accordance with one or more embodiments.

FIG. 5 is a flow chart illustrating an implementation of phase interpolation in accordance with one or more embodiments. One of ordinary skill in the art will understand that FIG. 5 includes all of the various embodiments previously disclosed. In one or more embodiments, the flowchart illustrated in FIG. 5 is repeated for each cycle of the clock.

In operation 502, one or more external signals including one or more external signals S1, S2, . . . , SM (where M is an integer corresponding to the number of signals received), where each signal has a corresponding phase signal Phi1, Phi2, . . . , PhiM, where each of the phase signals Phi1, Phi2, . . . , PhiM is relative to one another.

In operation 504, one or more interpolated signals S1', S2', . . . , SM' (where M' is an integer corresponding to the number of signals output) are generated. Each interpolated signal S1', S2', . . . , SM' includes a corresponding interpolated phase signal Phi1', Phi2', . . . , PhiM', where each of the interpolated phase signals Phi1', Phi2', . . . , PhiM' is relative to one another. The interpolated signals S1', S2', . . . , SM' are determined from the received signals S1, S2, . . . , SM.

In operation 506, phase detection is performed on the interpolated signals S1', S2', . . . , SM' including the interpolated phase signals Phi1', Phi2', . . . PhiM'. Phase detection includes determining the phase difference between each interpolated signal S1', S2', . . . , SM' including adjacent interpolated phase signal Phi1', Phi2', . . . PhiM' input to the phase detector.

In operation 508, a determination is made if each of the interpolated signals S1', S2', . . . , SM' (including the interpolated phase signals Phi1', Phi2', . . . PhiM') are early or late when compared to each of the adjacent interpolated signals S1', S2', . . . , SM' (including interpolated phase signals Phi1', Phi2', . . . PhiM') and generates an early or late control signal to dynamically adjust the interpolated signals S1', S2', . . . , SM' including (interpolated phase signals Phi1', Phi2', . . . PhiM'). For example, in one or more embodiments, where M is equal to 4, if the interpolated phase signal Phi2' is earlier than it should be in reference to interpolated phase signal Phi1', then the interpolated phase signal Phi2' is delayed by one clock cycle. For example, in one or more embodiments, where M is equal to 4, if the interpolated phase signal Phi2' is later than it should be in reference to interpolated phase signal Phi1', then the interpolated phase signal Phi2' is advanced by one clock cycle.

In operation 510, any of the previously interpolated signals S1', S2', . . . , SM' including (interpolated phase signals Phi1', Phi2', . . . PhiM') are advanced by one clock cycle.

In operation 512, any of the previously interpolated signals S1', S2', . . . , SM' including (interpolated phase signals Phi1', Phi2', . . . PhiM') are delayed by one clock cycle.

In one or more embodiments, the flowchart illustrated in FIG. 5 is repeated for each cycle of the clock.

One aspect of this description relates to a circuit includes a first circuit, a second circuit and a third circuit. The first circuit is configured to receive a first phase of a clock signal, a second phase of a clock signal and a first control signal. The first circuit is configured to generate a first interpolated phase of a clock signal. The second circuit is configured to receive a third phase of a clock signal, a fourth phase of a clock signal and a second control signal, and generate a second interpolated phase of a clock signal. The third circuit is configured to receive the first interpolated phase of the clock signal and the second interpolated phase of the clock signal, and generate the first control signal. The first control signal dynamically adjusts the first interpolated phase of the clock signal.

Another aspect of this description relates to a phase correction apparatus including an interpolator unit, a detector unit and a control unit. The interpolator unit generates a plurality of interpolated signals from each pair of a plurality of received signals. The detector unit generates a plurality of difference signals from each of the interpolated signals. The control unit generates a plurality of control signals from the difference signals. Each of the control signals dynamically control the interpolator unit by adjusting each of the interpolated signals.

Still another aspect of this description relates to a method of phase correction. The method including receiving a first phase of a clock, a second phase of the clock and a first control signal, receiving a third phase of the clock, a fourth phase of the clock and a second control signal, generating a first and second interpolated phase of the clock, detecting a phase from the first and second interpolated phase of the clock, and determining the first control signal from the detected phase.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A circuit comprising:
   a first circuit configured to receive a first phase of a clock signal, a second phase of a clock signal and a first control signal, and generate a first interpolated phase of a clock signal;
   a second circuit configured to receive a third phase of a clock signal, the second phase of the clock signal and a second control signal, and generate a second interpolated phase of a clock signal; and
   a third circuit configured to receive the first interpolated phase of the clock signal and the second interpolated phase of the clock signal, and generate the first control signal, wherein the first control signal dynamically adjusts the first interpolated phase of the clock signal.

2. The circuit of claim 1, further comprising:
   a fourth circuit configured to receive the third phase of the clock signal, a fourth phase of a clock signal and a third control signal, and generate a third interpolated phase of a clock signal;
   a fifth circuit configured to receive the second interpolated phase of the clock signal and the third interpolated phase of the clock signal, and generate the second control signal, wherein the second control signal dynamically adjusts the second interpolated phase of the clock signal.

3. The circuit of claim 1, wherein the first control signal comprises a first late control signal, wherein the first late control signal indicates that the first interpolated phase of the clock signal is later than the second interpolated phase of the clock signal.

4. The circuit of claim 1, wherein the first control signal comprises a first early control signal, wherein the first early control signal indicates that the first interpolated phase of the clock signal is earlier than the second interpolated phase of the clock signal.

5. The circuit of claim 1, wherein the first phase of the clock signal is adjacent to the second phase of the clock signal.

6. The circuit of claim 5, wherein the first interpolated phase of the clock signal is bounded by a first range defined by the first phase of the clock signal and the second phase of the clock signal.

7. The circuit of claim 1, wherein the second phase of the clock signal is adjacent to the third phase of the clock signal.

8. The circuit of claim 7, wherein the second interpolated phase of the clock signal is bounded by a second range defined by the second phase of the clock signal and the third phase of the clock signal.

9. The circuit of claim 1, wherein the first circuit comprises:
   a first select circuit; and
   a second select circuit,
   wherein the first select circuit and the second select circuit are configured to adjust the first interpolated phase of the clock signal based on a proportion of an amount of current that flows through the first select circuit to an amount of current that flows through the second select circuit.

10. A phase correction apparatus comprising:
    an interpolator unit, wherein the interpolator unit is configured to generate a plurality of interpolated signals from pairs of received signals;
    a detector unit, wherein the detector unit is configured to receive pairs of interpolated signals of the plurality of interpolated signals and generate difference signals, wherein each difference signal is generated based on a pair of interpolated signals of the plurality of interpolated signals; and
    a control unit configured to generate a plurality of control signals from the difference signals, wherein each of the control signals dynamically controls the interpolator unit by adjusting each of the interpolated signals.

11. The apparatus of claim 10, wherein the control signals comprise one or more late control signals, wherein each of the late control signals indicates the interpolated signal is later than an adjacent interpolated signal and the late control signal adjusts at least one of the interpolated signals.

12. The apparatus of claim 10, wherein the control signals comprise one or more early control signals, wherein each of the early control signals indicates the interpolated signal is earlier than an adjacent interpolated signal and the early control signal adjusts at least one of the interpolated signals.

13. The apparatus of claim 10, wherein each of the control units comprises a state machine.

14. The apparatus of claim 10, wherein the interpolator unit further comprises a current mode logic inverter unit.

15. The apparatus of claim 14, wherein the current mode logic inverter unit comprises a plurality of switch devices.

16. The apparatus of claim 15, wherein the plurality of switch devices comprises a plurality of NMOS transistor devices.

17. The apparatus of claim 15, wherein each of the switch devices receives the control signals, and an amount of signal adjustment by the control unit is proportionate to an amount of current flowing through the plurality of switch devices.

18. A method of phase correction, the method comprising:
    receiving a first phase of a clock signal, a second phase of a clock signal and a first control signal;
    receiving a third phase of a clock signal and a second control signal;
    generating a first interpolated phase of a clock signal from the first phase of the clock signal, the second phase of the clock signal and the first control signal;
    generating a second interpolated phase of a clock signal from the second phase of the clock signal, the third phase of the clock signal and the second control signal;
    detecting a phase difference between the first and second interpolated phase of the clock signal;
    determining the first control signal from the phase difference; and
    adjusting the first interpolated phase from the first control signal.

19. The method of claim 18, wherein adjusting the first interpolated phase comprises:
    advancing the first interpolated phase of the clock signal if the first interpolated phase of the clock signal is later than the second interpolated phase of the clock signal.

20. The method of claim 18, wherein adjusting the first interpolated phase comprises:
    delaying the first interpolated phase of the clock signal if the first interpolated phase of the clock signal is earlier than the second interpolated phase of the clock signal.

* * * * *